US008630140B2

(12) United States Patent
Lee

(10) Patent No.: US 8,630,140 B2
(45) Date of Patent: Jan. 14, 2014

(54) NON-VOLATILE MEMORY DEVICE HAVING REFERENCE CELLS, AND RELATED METHOD OF SETTING REFERENCE CURRENT

(75) Inventor: Wook-Hyoung Lee, Seongnam-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 190 days.

(21) Appl. No.: 13/185,535

(22) Filed: Jul. 19, 2011

(65) Prior Publication Data
US 2012/0026799 A1 Feb. 2, 2012

(30) Foreign Application Priority Data

Jul. 29, 2010 (KR) .................. 10-2010-0073620

(51) Int. Cl.
*G11C 7/02* (2006.01)
(52) U.S. Cl.
USPC ............ 365/210.1; 365/210.12; 365/206
(58) Field of Classification Search
USPC .......... 365/189.011, 206, 207, 210.1, 210.11, 365/210.12, 185.02, 185.07, 185.09
See application file for complete search history.

(56) References Cited

U.S. PATENT DOCUMENTS

| | | | | |
|---|---|---|---|---|
| 6,044,019 A * | 3/2000 | Cernea et al. | ............. | 365/185.21 |
| 6,707,715 B2 * | 3/2004 | Michael et al. | .......... | 365/185.18 |
| 6,799,256 B2 | 9/2004 | Van Buskirk et al. | | |
| 6,865,125 B2 * | 3/2005 | Tanzawa et al. | .............. | 365/200 |
| 6,963,505 B2 * | 11/2005 | Cohen | ....................... | 365/185.03 |
| 7,164,604 B2 * | 1/2007 | Arakawa | .................. | 365/185.21 |
| 7,403,421 B2 | 7/2008 | Mokhlesi et al. | | |
| 7,440,330 B2 * | 10/2008 | Noichi | ........................ | 365/185.2 |
| 7,463,514 B1 | 12/2008 | Haque | | |
| 7,535,765 B2 * | 5/2009 | Maayan | ..................... | 365/185.2 |
| 7,551,465 B2 | 6/2009 | Ghilardi et al. | | |
| 7,596,032 B2 * | 9/2009 | Ogawa et al. | .............. | 365/185.2 |
| 7,609,557 B2 | 10/2009 | Aritome | | |
| 7,630,240 B2 | 12/2009 | Roohparvar | | |
| 8,374,035 B2 * | 2/2013 | Choi | ........................ | 365/185.18 |
| 2003/0137878 A1 * | 7/2003 | Gonzalez et al. | ........ | 365/185.21 |
| 2004/0017718 A1 * | 1/2004 | Ooishi | ......................... | 365/210 |
| 2008/0117675 A1 * | 5/2008 | Haque et al. | ............. | 365/185.03 |
| 2008/0144369 A1 * | 6/2008 | Barkley | ................... | 365/185.03 |
| 2008/0192537 A1 | 8/2008 | Kasuta | | |
| 2010/0290301 A1 * | 11/2010 | Scheuerlein | .................. | 365/206 |

FOREIGN PATENT DOCUMENTS

| | | |
|---|---|---|
| JP | 2005526341 | 9/2005 |
| JP | 2006-216196 | 8/2006 |
| JP | 2008-192232 | 8/2008 |
| KR | 1020010065150 A | 7/2001 |

(Continued)

OTHER PUBLICATIONS

H. Kurata et al., "The Impact of Random Telegraph Signals on the Scaling of Multilevel Flash Memories", Symposium on VLSI 2006.
R. V. Wang et al., "Shallow Trench Isolation Edge Effect on Random Telegraph Signal Noise and Implications for Flash Memory", IEEE Trans. Electron Device vol. 56, No. 9, pp. 2107-2113, Sep. 2009.

(Continued)

*Primary Examiner* — Son Dinh
*Assistant Examiner* — Uyen B Tran
(74) *Attorney, Agent, or Firm* — Volentine & Whitt, PLLC

(57) ABSTRACT

A method of setting a reference current of a nonvolatile memory device comprises measuring a noise characteristic of each of multiple reference cells, and selecting at least one of the reference cells as a reference cell for generating a reference current according to the measured noise characteristics.

20 Claims, 12 Drawing Sheets

(56) References Cited

FOREIGN PATENT DOCUMENTS

| | | |
|---|---|---|
| KR | 1020030071494 A | 9/2003 |
| KR | 1020040019991 A | 3/2004 |
| KR | 1020060100855 A | 3/2005 |
| KR | 1020050003365 A | 9/2006 |

OTHER PUBLICATIONS

Hideaki Kurata et al., "Random Telegraph Signal in Flash Memory: Its Impact on Scaling of Multilevel Flash Memory Beyond the 90-nm Node", IEEE Journal of Solid-State Circuits, vol. 42, No. 6, pp. 1362-1369, Jun. 2007.

* cited by examiner

NON-VOLATILE MEMORY DEVICE HAVING REFERENCE CELLS, AND RELATED METHOD OF SETTING REFERENCE CURRENT

CROSS-REFERENCE TO RELATED APPLICATIONS

This application claims priority under 35 U.S.C §119 to Korean Patent Application No. 10-2010-0073620 filed on Jul. 29, 2010, the disclosure of which is hereby incorporated by reference in its entirety.

BACKGROUND

Embodiments of the inventive concept relate generally to semiconductor memory devices. More particularly, embodiments of the inventive concept relate to nonvolatile memory devices comprising reference cells, and related methods of setting reference currents.

Semiconductor memory devices can be broadly classified in two categories based on whether or not they retain stored data when disconnected from power. These categories include volatile semiconductor memory devices, which lose stored data when disconnected from power, and nonvolatile semiconductor memory devices, which retain stored data when disconnected from power. Examples of volatile semiconductor memory devices include static random access memory (SRAM) devices and dynamic random access memory (DRAM) devices. Examples of nonvolatile semiconductor memory devices include various types of read only memory (ROM), such as MROM, PROM, EPROM, and EEPROM.

Among nonvolatile memory devices, flash memory is relatively inexpensive and provides relatively high performance and data storage capacity. Due to these and other attractive features, flash memory has achieved increasing popularity in recent years.

Flash memory can be divided into NAND-type and NOR-type flash memory according to different memory cell array architectures. NAND-type flash memory is suitable for mass storage because of its simple structure and is used in storage devices such as a USB memory sticks, MP3 players, a solid state drives (SSDs), and the like. On the other hand, NOR-type flash memory provides high-speed access and is often used to store program code. Accordingly, NOR-type flash memory is commonly applied to mobile terminals required to process data at a high speed.

Storage capacity and integration density are important parameters in both NOR-type and NAND-type flash memories. High integration density can provide these memories with high storage capacity in a limited chip area. Storage capacity can also be improved without increasing integration density by storing multi-bit data in each memory cell. A memory cell capable of storing multi-bit data is called a multi-level cell (MLC), and a memory cell capable of storing only one bit data is called a single level cell (SLC).

New problems arise when integration density is increased and MLC technology is employed. For example, one problem is that MLC read margins are reduced because more data bits/states are distributed within a limited voltage window. Further, high integration density typically involves small memory cells having small channel or drain currents. Under these conditions, the memory cells are more susceptible to noise such as random telegraph signal (RTS) noise, which can decrease the reliability of the flash memory devices.

SUMMARY

According to one embodiment of the inventive concept, a method of setting a reference current of a nonvolatile memory device comprises measuring a noise characteristic of each of multiple reference cells, and selecting at least one of the reference cells as a reference cell for generating a reference current according to the measured noise characteristics.

According to another embodiment of the inventive concept, a nonvolatile memory device comprises a main cell array comprising a plurality of memory cells, a reference signal generator generating a reference current for reading data stored in a selected one of the plurality of memory cells, and a sense amplifier identifying data stored in the selected memory cell by comparing the reference current to a sensing current flowing through the selected memory cell. The reference signal generator comprises a plurality of reference cells and generates the reference current from at least one of the plurality of reference cells, the at least one reference cell being selected according to measured noise characteristics of the plurality of reference cells.

According to still another embodiment of the inventive concept, a method of generating a reference current for a nonvolatile memory device comprises identifying a plurality of reference cells having noise characteristics within a predetermined limit, and combining currents associated with the plurality of reference cells to generate the reference current.

These and other embodiments can be used to improve the reliability of read operations performed by nonvolatile memory devices.

BRIEF DESCRIPTION OF THE DRAWINGS

The drawings illustrate selected embodiments of the inventive concept. In the drawings, like reference numbers indicate like features.

DETAILED DESCRIPTION

Figure 1:
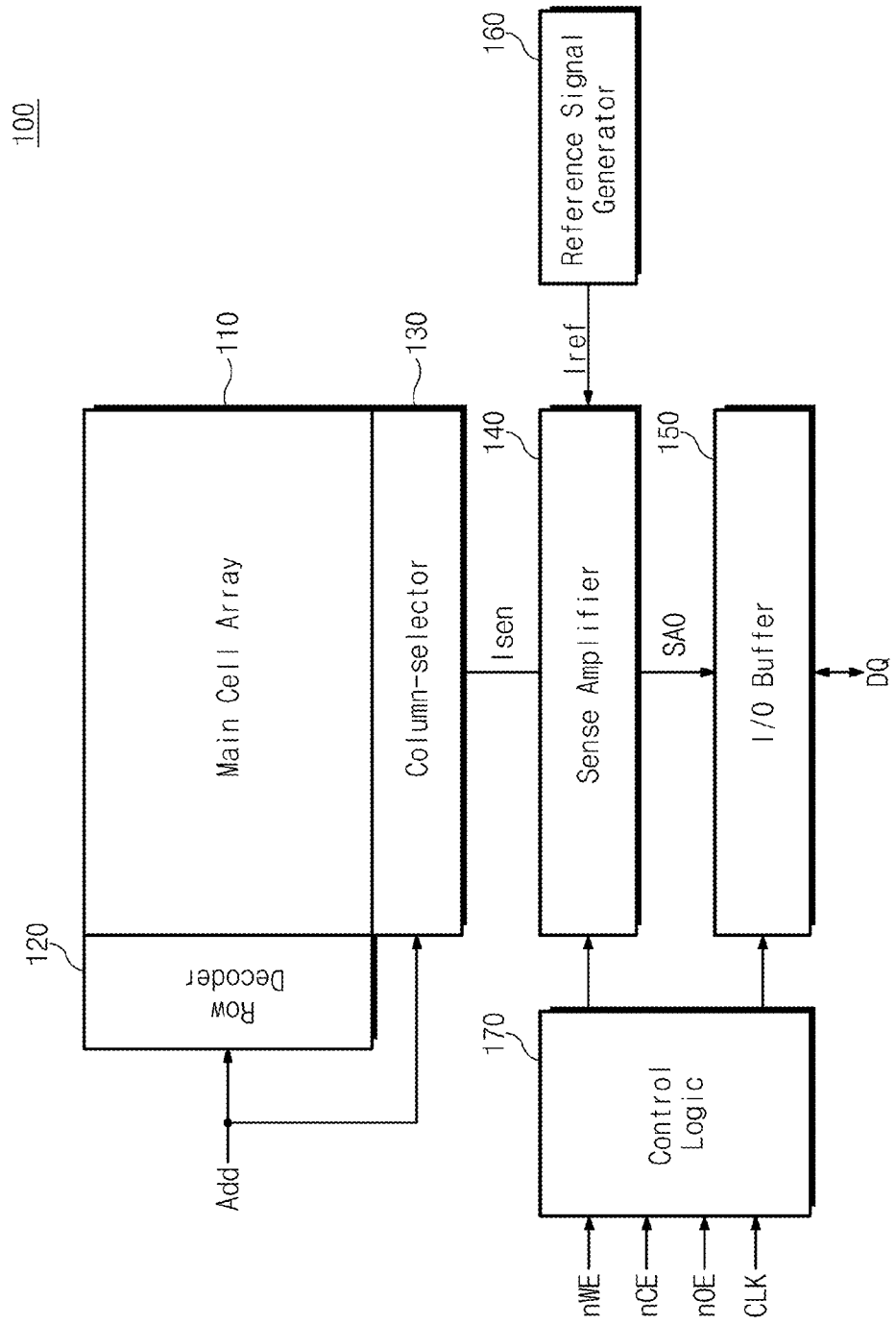
FIG. 1 is a block diagram illustrating a nonvolatile memory device according to an embodiment of the inventive concept.

The inventive concept is described more fully hereinafter with reference to the accompanying drawings, in which embodiments of the inventive concept are shown. The inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art.

In the description that follows, the terms first, second, third etc. are used to describe various features. However, the described features should not be limited by these terms. Rather, these terms are used merely to distinguish between different features. Accordingly, a first feature discussed below could be termed a second feature without departing from the scope of the inventive concept.

Spatially relative terms, such as "beneath", "below", "lower", "under", "above", "upper" and the like, may be used herein for ease of description to describe one feature's relationship to another feature as illustrated in the figures. The spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. The terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" encompasses any and all combinations of one or more of the associated listed items.

Where a feature is referred to as being "on", "connected to", "coupled to", or "adjacent to" another feature, it can be directly on, connected, coupled, or adjacent to the other feature, or intervening features may be present. In contrast, where a feature is referred to as being "directly on," "directly connected to", "directly coupled to", or "immediately adjacent to" another feature, there are no intervening features present.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art, and should not be interpreted in an idealized or overly formal sense unless expressly so defined herein.

In the description that follows, various embodiments are described with reference to a NOR-type flash memory device. The inventive concept, however, is not limited to NOR-type flash memory, and can be embodied in many other forms, including other types of nonvolatile memory devices. For example, certain embodiments comprise nonvolatile memory devices such as phase change random access memory (PRAM), resistive random access memory (RRAM), resistive memory, nano floating gate memory (NFGM), polymer random access memory (PoRAM), magnetic random access memory (MRAM), or ferroelectric random access memory (FRAM).

FIG. 1 is a block diagram illustrating a nonvolatile memory device 100 according to an embodiment of the inventive concept.

Referring to FIG. 1, nonvolatile memory device 100 comprises a main cell array 110, a row decoder 120, a column selector 130, a sense amplifier 140, an input/output buffer 150, a reference signal generator 160, and control logic 170. Nonvolatile memory device 100 senses data stored in main cell array 110 using a reference current Iref provided from reference signal generator 160.

Main cell array 110 comprises a plurality of NOR-type flash memory cells connected to word lines and bit lines. A plurality of NOR-type flash memory cells are connected in parallel to each bit line. In a read operation, a read voltage Vrd (e.g., about 5V in a single level cell (SLC)) is applied to a word line, and a voltage of about 1V is applied to a bit line. While these voltages are applied, a selected memory cell is identified as an ON cell or an OFF cell according to a sensing current flowing into a corresponding bit line. This sensing is performed by sense amplifier 140 as will be described below.

Row decoder 120 selects one of a plurality of rows in response to an address Add (i.e., a row address). Row decoder 120 provides a selected row (or, word line) with a read voltage Vrd or program voltage Vpgm (e.g., about 10V) provided from a voltage generator (not shown). In an erase operation, row decoder 120 transfers a negative high voltage (about −8V) to word lines of main cell array 110.

Column selector 130 selects a bit line in response to an address Add (i.e., a column address). In a read operation, column selector 130 electrically connects a selected bit line to sense amplifier 140. In a program operation, column selector 130 connects the selected bit line to a write driver (not shown).

Sense amplifier 140 senses data stored in a selected memory cell under the control of control logic 170. In a read operation, a sensing current Isen flowing into a drain of a selected memory cell is transmitted to sense amplifier 140. Reference current Iref is transmitted to sense amplifier 140 from reference signal generator 160. Sense amplifier 140 then compares sensing current Isen to reference current Iref and determines a logical state (logical '1' or logical '0') of data stored in a selected memory cell according to the comparison.

Next, sense amplifier 140 transfers the determined logical state to input/output buffer 150 as sensing data SA0. Sense amplifier 140 can perform a serial sensing operation or a parallel sensing operation to sense data stored in a multi-level cell. With the serial sensing operation, an upper bit (e.g., a most significant bit) and a lower bit (e.g., a least significant bit) of multi-bit/level data are sensed serially. With the parallel sensing operation, upper and lower bits of multi-bit/level data are read out at the same time through one sensing operation. The reliability of reference current Iref affects the ability of nonvolatile memory device 100 to correctly discriminate data stored in memory cells regardless of whether memory cells are single-level cells or multi-level cells.

Input/output buffer 150 temporarily stores sensing data SA0 provided from sense amplifier 140 under the control of control logic 170. Input/output buffer 150 outputs sensing data SA0 to an external source as output data DQ under the control of control logic 170. In a program operation, input/output buffer 150 is configured to store data provided from an external source and to send the data to a write buffer (not shown) or a write driver (not shown).

Reference signal generator 160 provides reference current Iref to sense amplifier 140. Reference signal generator 160 provides reference current Iref of a stable level regardless of noise (e.g., random telegraph signal (RTN) noise) due to high integration density or peripheral electromagnetic interference. Reference signal generator 160 typically generates reference current Iref using at least one reference cell among a plurality of reference cells, the at least one reference cell being a noise-free reference cell or having relatively less noise.

Alternatively, reference signal generator 160 can processes reference currents generated from a plurality of reference cells to compensate for noise. For example, noise compensation may be made by averaging reference currents each generated from a different reference cell. Random noise signals tend to be independent from one another in the time domain. As a result, their cross correlation is typically low, so it is possible to increase the compensation effect of random noise by applying an averaging operation.

Reference signal generator 160 can be used to generate a reference current using at least one reference cell having noise lower in level than a reference value, of reference cells. Reference signal generator 160 can be implemented to exclude reference cells having large noise from a combination for generation of a reference current. Information on selection or exclusion of specific reference cells is called selection information. Reference signal generator 160 can be configured to store the selection information. The selection information is generated after noise characteristics of reference cells are measured. This will be more fully described with reference to FIGS. 2 through 5.

Control logic 170 controls sense amplifier 140 and input/output buffer 150 in response to control signals "new", nCE, and nOE and a clock signal CLK provided from an external source. A write enable signal "new" is related to reception of data provided from an external source at a write operation. A chip enable signal nCE is used to control activation of nonvolatile memory device 100. In a read operation, data temporarily stored in input/output buffer 150 is transferred to an external destination in response to output enable signal nOE.

Nonvolatile memory device 100 generates a reference current Iref having relatively high precision regardless of noise or interference. Accordingly, nonvolatile memory device 100 reduces deterioration of read margin due to inexactness of reference current Iref. Although the embodiment of FIG. 1 identifies data stored in a memory cell by sensing a sensing current Isen flowing to a bit line, the inventive concept is not limited to this sensing approach. For example, in certain alternative embodiments, stored data is identified by measuring a sensing voltage developed on a bit line. In such embodiments, reference signal generator 160 can generate a reference voltage based on the above-described functions.

Figure 2:
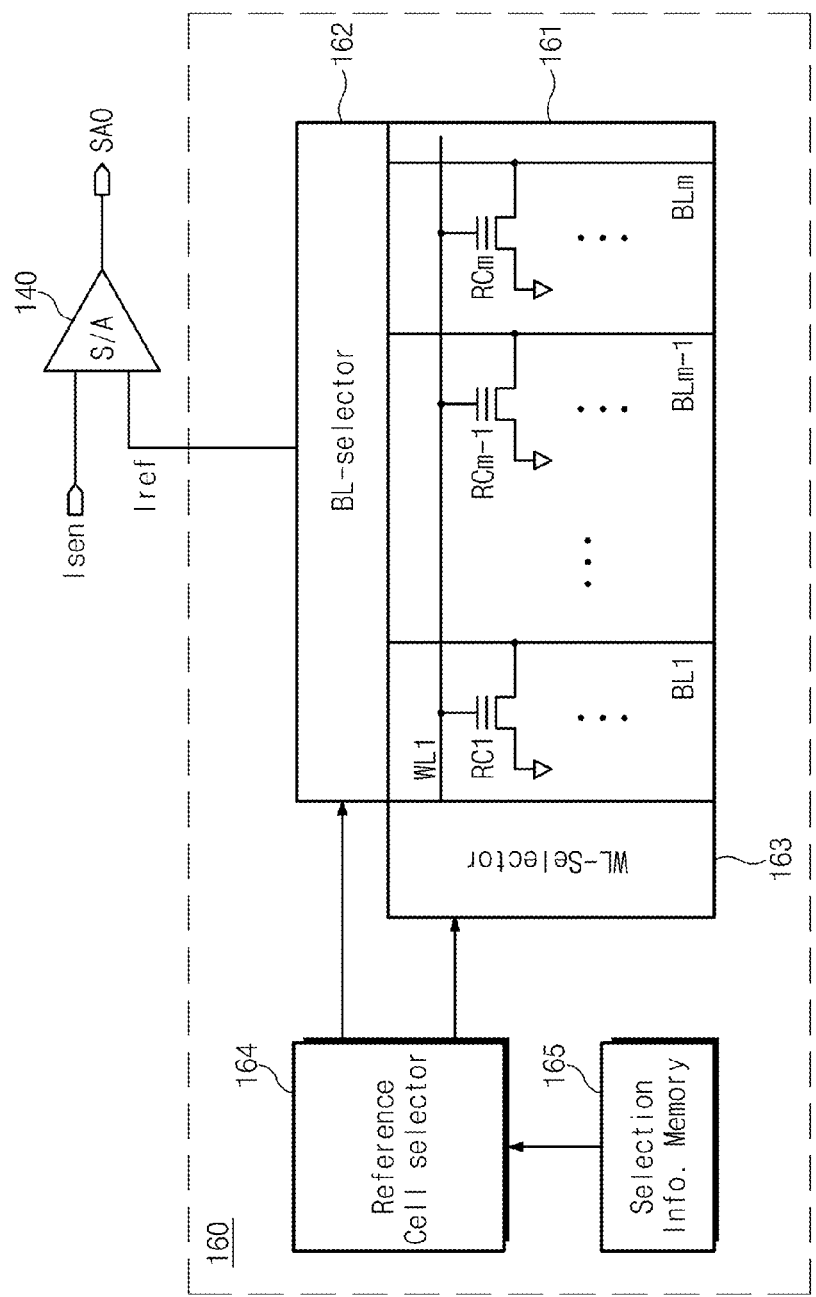
FIG. 2 is a block diagram illustrating a reference current generator of FIG. 1 according to an embodiment of the inventive concept.

FIG. 2 is a block diagram illustrating an example of reference current generator 160 according to an embodiment of the inventive concept.

Referring to FIG. 2, reference signal generator 160 comprises a reference cell array 161, a bit line selector 162, a word line selector 163, a reference cell selector 164, and a selection information memory 165. Sense amplifier 140 compares a reference current Iref and a sensing current Isen, as described with reference to FIG. 1, and outputs sensing data SA0 as a result of the comparison.

Reference cell array 161 comprises a plurality of reference cells arranged in rows and columns. The reference cells are formed to have the same I-V characteristic as memory cells of main cell array 110. In the example of FIG. 2, only one word line is shown connected to reference cells RC1 through RCm. However, additional word lines can be provided in reference cell array 161.

Bit line selector 162 and word line selector 163 select one of reference cells under the control of reference cell selector 164. Bit line selector 162 operates similar to column selector 130 of FIG. 1, and word line selector 163 functions similar to row decoder 120 of FIG. 1.

Reference cell selector 164 generates an address to select one of reference cells in reference cell array 161. For example, reference cell selector 164 refers to selection information memory 165 and selects any reference cell, being substantially free from noise, interference, and defect, among the reference cells.

Selection information memory 165 stores information associated with locations of reference cells to generate a reference current Iref among the reference cells of reference cell array 161. Selection information memory 165 stores an address of a reference cell for generating a reference current Iref with relatively high precision. Further, information for excluding inappropriate reference cells can be stored in selection information memory 165. For example, information associated with defective reference cells detected at a test process and reference cells generating noise over a reference value can be stored in selection information memory 165 as information for excluding them from generating of a reference current Iref.

Selection information memory 165 can be formed of a nonvolatile memory that stores selection information generated by measuring noise characteristics at a test operation. For example, selection information memory 165 can be formed of a programmable fuse block. Selection information memory 165 can be formed of a programmable electric fuse (e-FUSE). In some embodiments, selection information memory 165 is formed of a memory such as a PROM, EPROM, EEPROM, MRAM, PRAM, RRAM, FeRAM, or flash memory.

Reference signal generator 160 is capable of generating reference current Iref with relatively high precision, which can contribute to an improved read margin of nonvolatile memory device 100. Moreover, it is possible to improve the yield by excluding defective reference cells. Generating reference current Iref with relatively high precision enables the reliability of a read operation of the nonvolatile memory device 100 to be improved.

Figure 3A:
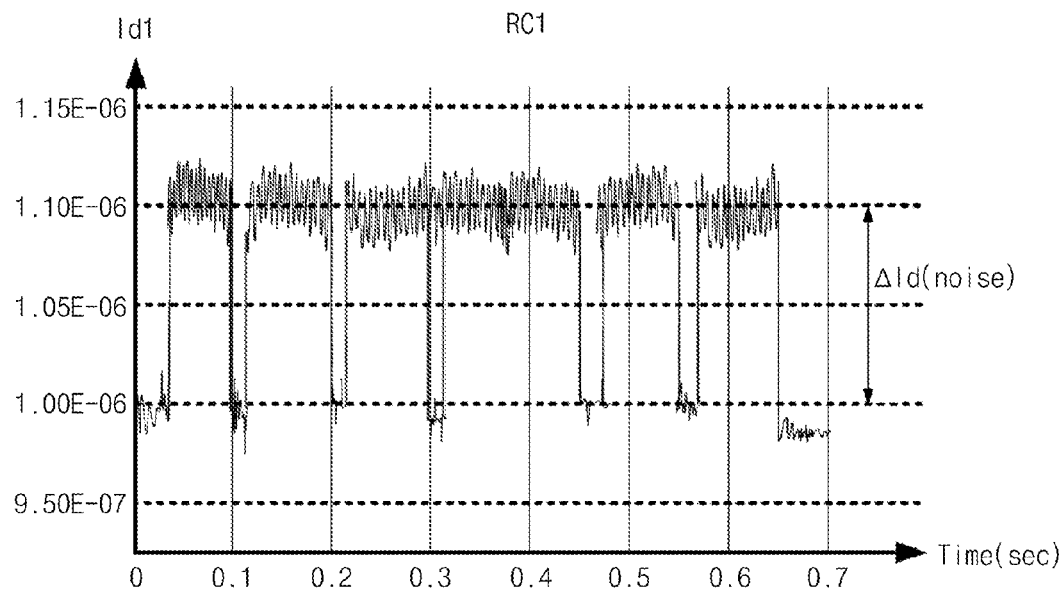
FIG. 3A is a graph illustrating a current characteristic of a reference cell having RTS noise.
Figure 3B:
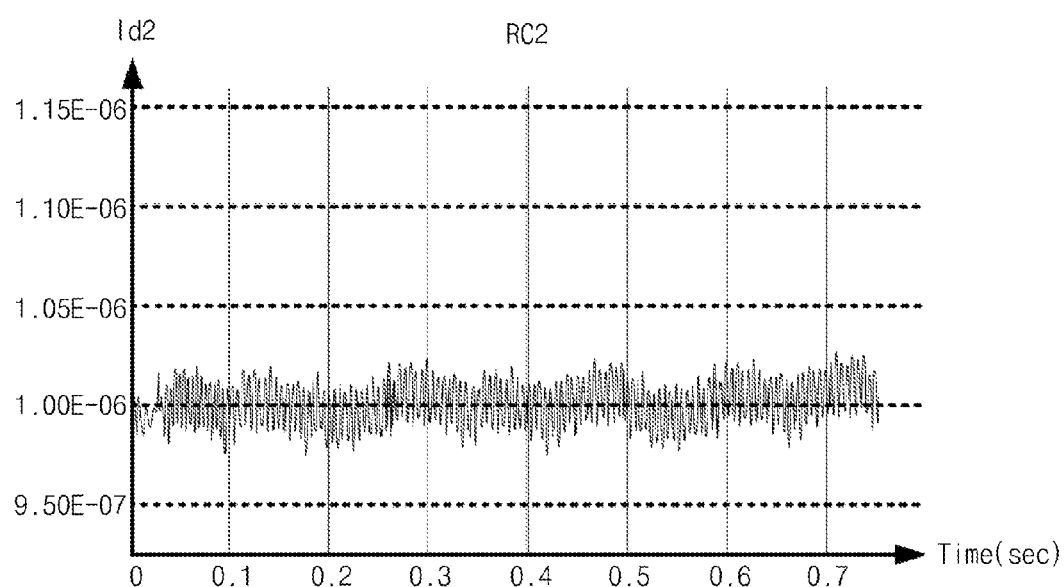
FIG. 3B is a graph illustrating a current characteristic of a reference cell operating normally.

FIG. 3A is a graph illustrating a drain current of a reference cell RC1 having RTS noise, and FIG. 3B is a diagram illustrating a drain current of a reference cell RC2 operating normally.

Referring to FIG. 3A, the drain current of reference cell RC1 is shown under a specific bias condition in which voltages are applied to a gate, a source, and a drain of reference cell RC1. Main memory cells and/or reference cells are generally scaled down in size due to high integration density. This reduces the amount of charge operating in these cells. The reduced amount of charge tends to reduce drain current, which tends to magnify the effect of noise. For instance, unintended noise may increase due to a charge trap at an insulation film between a floating gate and a channel of reference cell RC1, or at a corner of a shallow trench isolation film. Such unintended noise causes a drain current Id1 to fluctuate. Accordingly, a drain current Id1 of reference cell RC1 may be unstable due to affection of RTS noise, so that drain current Id1 experiences current fluctuation ΔId caused by noise as shown in FIG. 3A.

Referring to FIG. 3B, a drain current Id2 of reference cell RC2 operating normally is stable compared to that of reference cell RC1. Drain current Id2 of about 1 μA continuously flows through reference cell RC2 under the specific bias condition. As a result, a likelihood that charge is trapped at an insulation film of reference cell RC2 or a corner of a shallow trench isolation film is reduced. Accordingly, reference cell RC2 can be considered to be a reference cell that is less affected by RTS noise.

Selection information memory 165 of FIG. 2 stores selection information of a reference cell RC2 that is substantially free from noise or has relatively less noise. Noise characteristics of all reference cells in a reference cell array 161 of FIG. 2 can be measured during a test process. According to a measurement result, reference cells (e.g., RC1) affected by noise are excluded, and reference cells (e.g., RC2) operating normally are selected to generate a reference current. Reference cell Iref generated from a noise-free or noise-less reference cell RC2 have relatively high precision, which can improve the reliability of a sensing operation of a sense amplifier 140.

Figure 4:
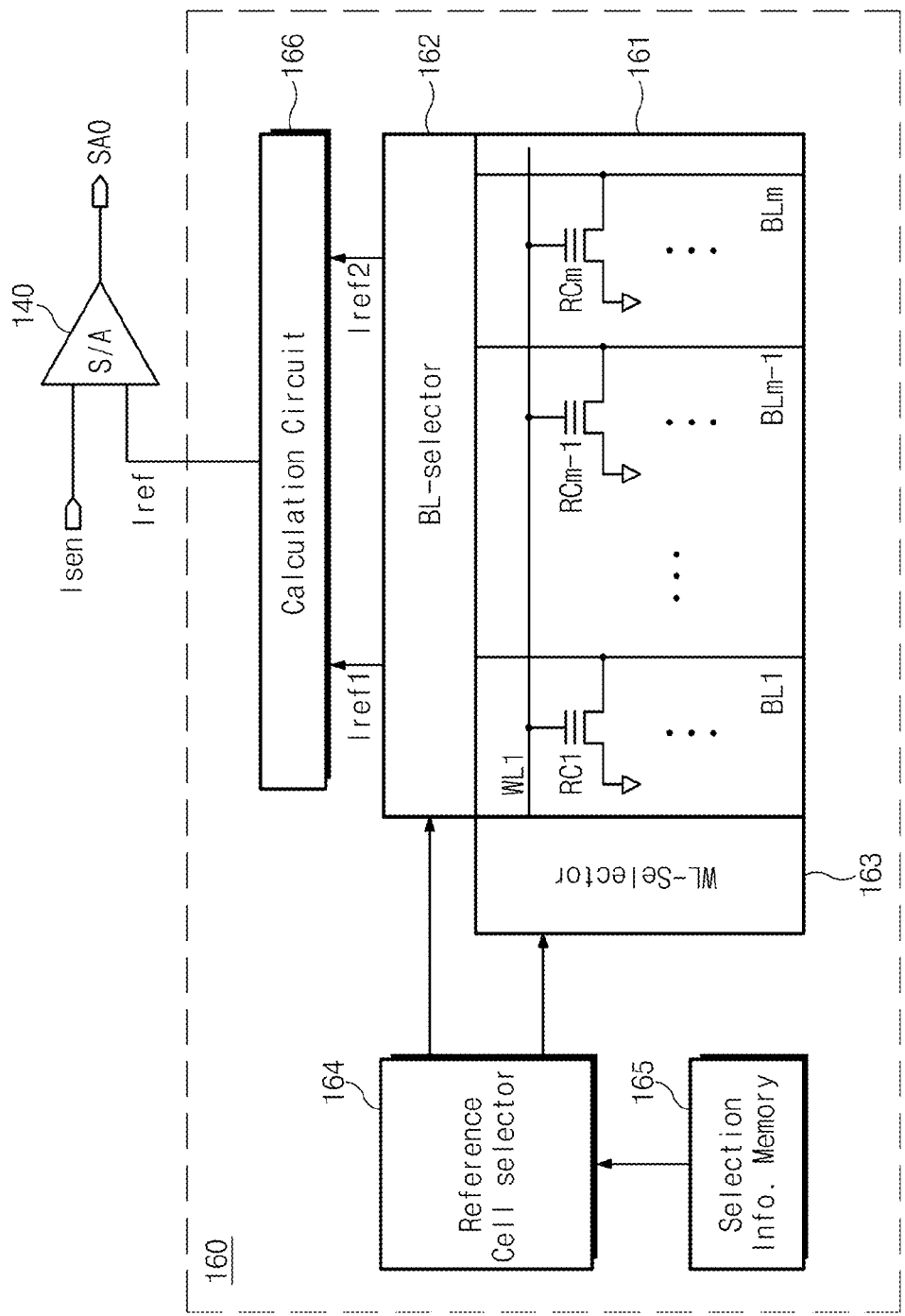
FIG. 4 is a block diagram illustrating a reference signal generator in FIG. 1 according to another embodiment of the inventive concept.

FIG. 4 is a block diagram illustrating a reference signal generator in FIG. 1 according to another embodiment of the inventive concept. Referring to FIG. 4, reference signal generator 160 is similar to that of FIG. 2 except that a calculation circuit is added.

At least two reference cells are selected at the same time by bit line selector 162 and word line selector 163 under the control of reference cell selector 164. For example, a word line is selected by word line selector 163, and at least two bit lines are selected by bit line selector 162. Alternatively, two or more word lines are selected by word line selector 163, and bit lines being connected to calculation circuit 166 are selected by bit line selector 162.

Reference cell selector 164 is configured to select at least two or more reference cells among a plurality of reference cells included in reference cell array 161. Reference cell selector 164 refers to a selection information memory 165 and controls selectors 162 and 163 to select at least two or more reference cells of the plurality of reference cells. At this time, reference cells selected by reference cell selector 164 do not include reference cells excluded in a test operation.

Selection information memory 165 stores location information of reference cells for generating a reference cell among the plurality of reference cells. In a test process, selection information memory 165 stores selection information for excluding reference cells having noise above a reference value. For example, upon testing, noise of reference cells can be measured by measuring current characteristics of reference cells. Location information of reference cells with noise less than a reference value can be stored in selection information memory 165. Alternatively, in a test process, location information can be stored in selection information memory 165 for reference cells having noise above a reference value. In this case, reference cells having significant noise can be excluded from the generation of a reference cell current.

Selection information memory 165 can be formed of a nonvolatile memory that stores selection information generated through measurement of noise characteristics at a test process. For example, selection information memory 165 may be formed of a programmable fuse block or a programmable electric fuse (e-FUSE). Selection information memory 165 can also be formed of a nonvolatile memory such as a PROM, EPROM, EEPROM, MRAM, PRAM, RRAM, FRAM, or flash memory.

Calculation circuit 166 performs operations on reference currents provided from selected reference cells, such as reference currents Iref1 and Iref2. For example, calculation circuit 166 can average reference currents Iref1 and Iref2. In some embodiments, calculation circuit 166 is formed of an analog circuit that sums reference currents from selected reference cells and divides a summed current value by a number of the selected reference cells. Alternatively, calculation circuit 166 can be formed of a logical circuit that digitizes reference currents and averages a digitized result arithmetically.

Calculation circuit 166 is not limited to a configuration for an averaging operation. Various arithmetic operations and a combination of operations can be applied to generate a reference current via calculation circuit 166. Moreover, two or more reference cells can be used to generate a reference current. For example, where three reference cells are selected, three reference currents are provided to calculation circuit 166 from the three reference cells thus selected. Accordingly, it is possible to generate a more reliable reference current using more reference cells.

Although an averaging technique is described as one way to generate a reference current, the inventive concept is not limited to the averaging technique. For example, it is possible to reference current Iref by arithmetically combining reference currents in various manners.

Figure 5A:
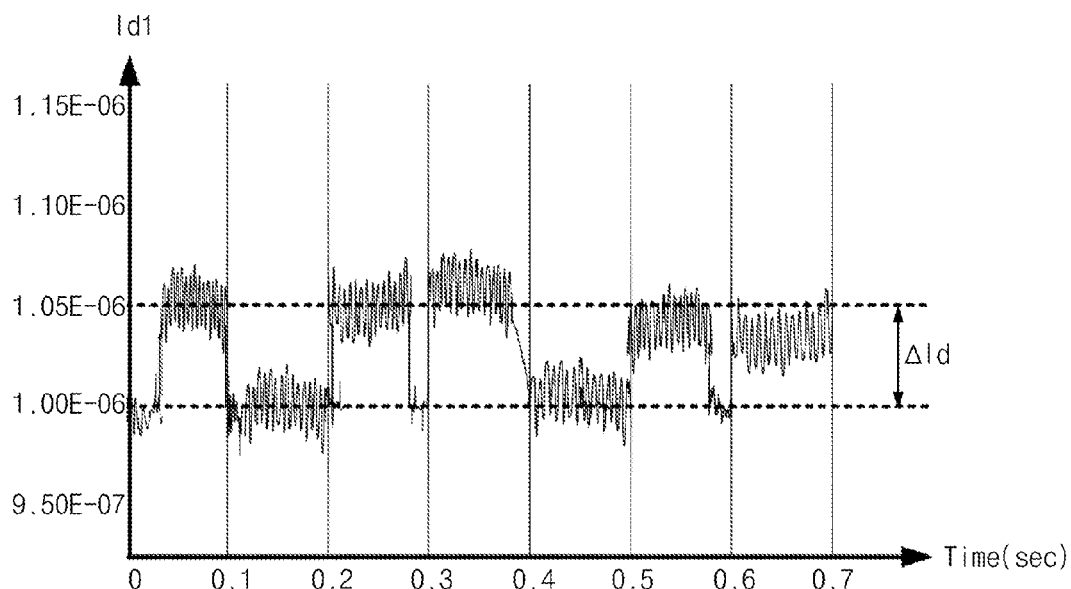
FIGS. 5A and 5B are graphs illustrating current characteristics of reference cells including noise.
Figure 5B:
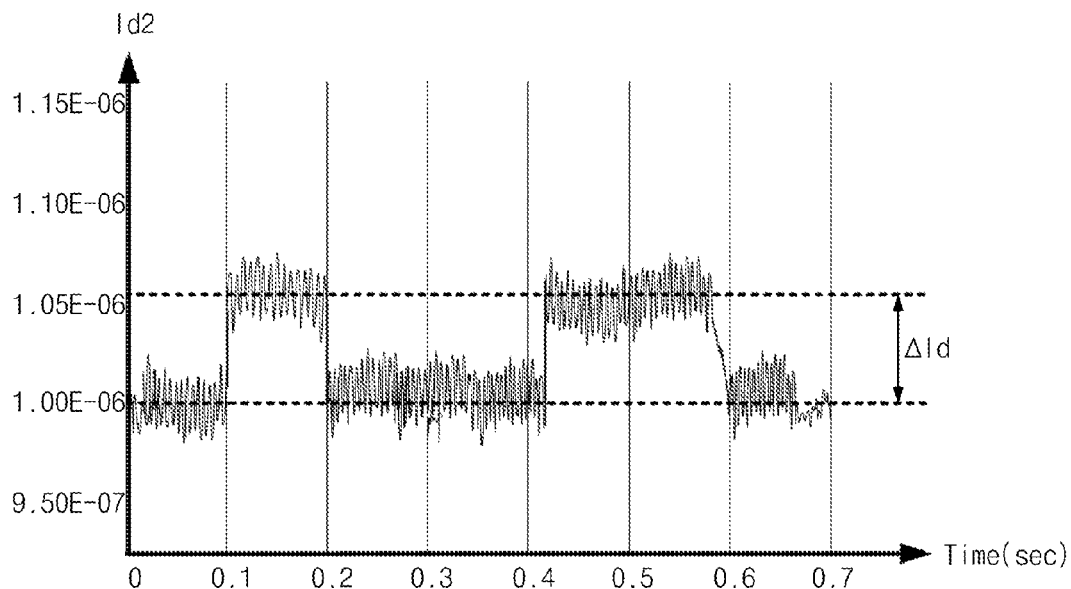
Figure 5C:
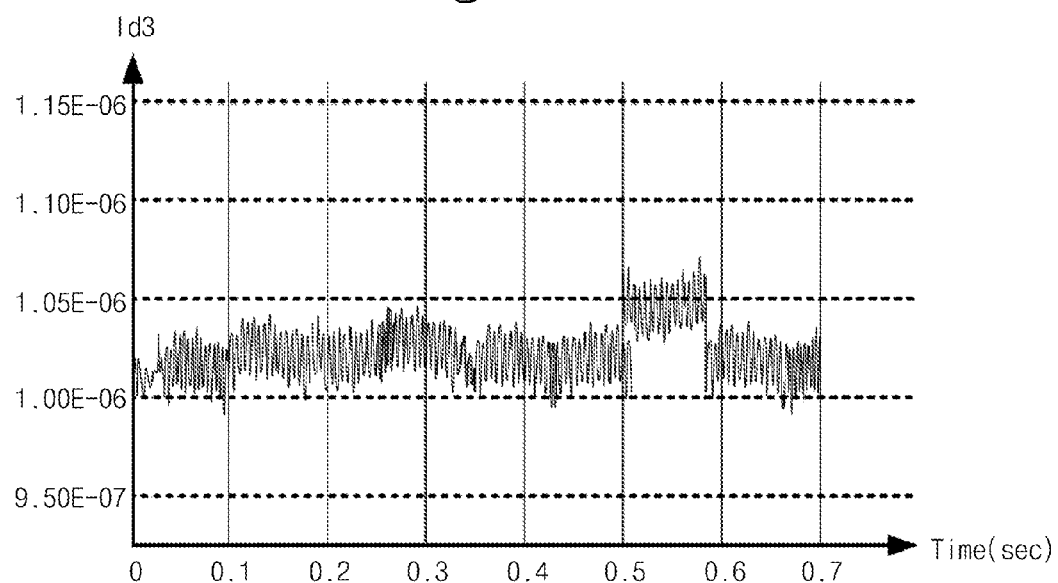
FIG. 5C is a graph illustrating a waveform obtained by averaging currents in FIGS. 5A and 5B.

FIGS. 5A and 5B are graphs illustrating drain currents of reference cells including noise, and FIG. 5C is a graph illustrating a waveform of current obtained by averaging the drain currents of FIGS. 5A and 5B.

FIGS. 5A and 5B show drain currents Id1 and Id2 of reference cells including RTS noise. In general, reference cells selected to generate a reference current can be formed of reference cells that are relatively noise free. However, in a worst case, selected reference cells have RTS noise. The RTS noise can be viewed as random noise from a statistical perspective. One characteristic of the random noise is non-cross-correlation. Accordingly, although two random noises are summed within the same period of time, total noise power is not affected. A drain current Id1 in FIG. 5A and a drain current Id2 in FIG. 5B show such correlation.

As illustrated in FIG. 5C, as drain currents are averaged, the effects of RTS noise are markedly reduced. The described examples present a worst case where reference cells affected by RTS noise are selected. However, it is possible to generate a reference current Iref more reliably using the above-described averaging manner and reference cells affected by RTS noise.

Figure 6:
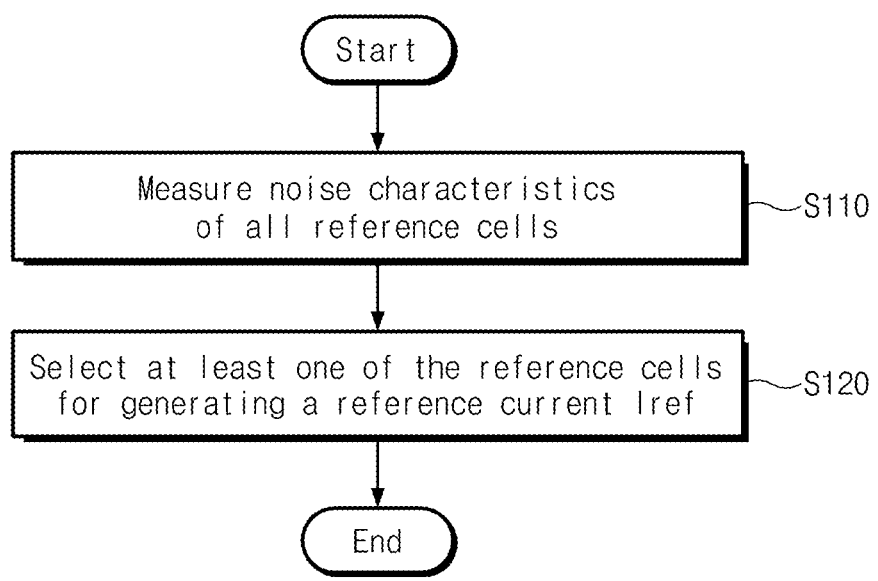
FIG. 6 is a flowchart illustrating a method of setting a reference current according to an embodiment of the inventive concept.

FIG. 6 is a flowchart illustrating a method of setting a reference current according to an embodiment of the inventive concept. In the method of FIG. 6, noise characteristics are measured for of all reference cells included in nonvolatile memory device 100. One or more of the reference cells are selected to generate a reference current.

Referring to FIG. 6, noise characteristics are measured for all reference cells included in nonvolatile memory device 100 (S110). The noise characteristics are typically measured in a test process, such as an EDS test. To measure the noise characteristics, a selected reference cell is placed under voltage bias conditions. In particular, a gate voltage is applied to a word line of the selected reference cell, a drain voltage is applied to a bit line, and a source voltage is applied to a source line. The gate, drain, and source voltages may have predetermined values for noise measurement.

A drain current flows into a bit line of the selected reference cell under the above bias conditions. Noise characteristic of the selected reference cell are ascertained by measuring the drain current of the selected reference cell during a given time. For example, where a fluctuation ΔId of a drain current of the selected reference cell is large, the selected reference cell is judged to generate RTS noise. Alternatively, where a probability distribution of a drain current of the selected reference cell does not form a normal distribution (e.g., a Gaussian), the selected reference cell is determined to generate RTS noise. A tester may measure noise characteristics of reference cells and store measured results.

Next, reference cells are selected to generate a reference current of nonvolatile memory device 100 (S120). For example, one or more reference cells with relatively high reliability can be selected according to the measured results. Alternatively, reference cells having relatively poor noise characteristics can be excluded where a reference current is generated from two or more reference cells. Such selection information can be stored in selection information memory 165 of FIG. 2 or 4.

In the method of FIG. 6, a reference current is generated by selecting reference cells having relatively good noise characteristics. Accordingly, it is possible to secure read margin of a high-density nonvolatile memory device by providing a reference current with relatively high reliability in a read operation.

Figure 7:
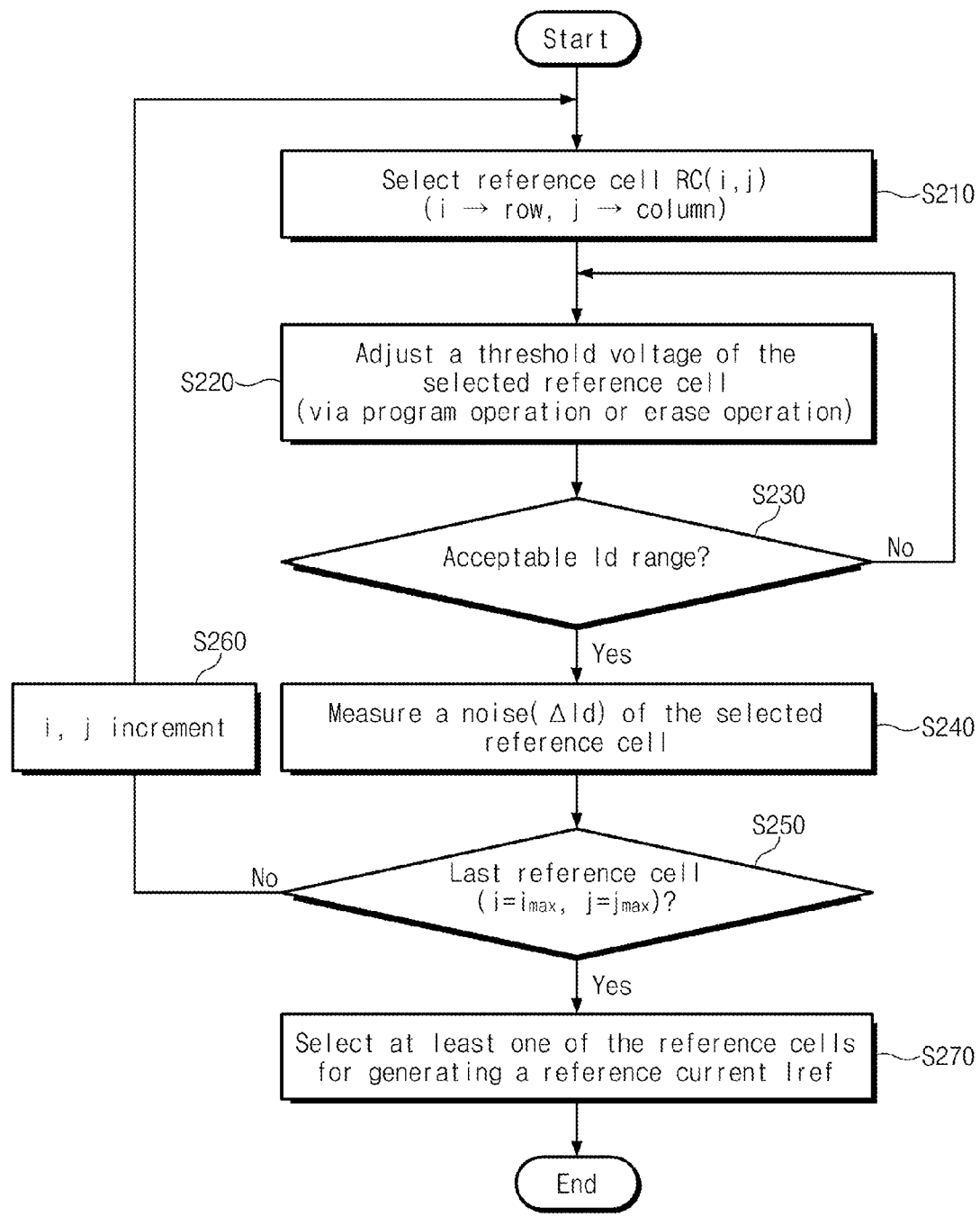
FIG. 7 is a flowchart illustrating a method of setting a reference current according to another embodiment of the inventive concept.

FIG. 7 is a flowchart illustrating a method of setting a reference current according to another embodiment of the inventive concept. In the description of FIG. 7, certain operations will be described with reference to nonvolatile memory device 100 of FIG. 1. In addition, it is assumed that the method is performed in the context of a test process, such as an EDS test.

Referring to FIG. 7, once a reference cell setting operation of a test process commences, a tester is connected with a test pad of a nonvolatile memory device 100 to access a reference cell (S210). The tester selects one reference cell RC(i,j) among an array of i×j reference cells (i≥1, j≥1). Herein, variables 'i' and 'j' indicate row and column addresses of reference cell array 161.

Next, the tester adjusts a threshold voltage of a selected reference cell RC(i,j) (S220). Setting the threshold voltage of the reference cell is referred to as "reference cell trimming" The tester sets the threshold voltage of the selected reference cell to generate a reference current with a target value for a specific bias condition. The adjustment to the threshold voltage can be accomplished through a program or erase operation for injecting or removing charge in a floating gate of the selected reference cell. The tester can adjust a threshold voltage of the selected reference cell by controlling a word line of the selected reference cell and a bit line or a source line.

Next, the tester detects whether the selected reference cell RC(i,j) operates normally (S230). The tester biases reference cell RC(i,j) via selected word line and bit line according to a specific voltage condition. Then, the tester measures a drain current Id flowing through the selected bit line. The tester determines whether the measured drain current Id is within an allowable range. Where the measured drain current Id is not within an allowable range (S230=No), the method returns to step S220, in which a threshold voltage of the selected reference cell RC(i,j) is again adjusted.

Where the measured drain current Id is within an allowable range (S230=Yes), the tester again adjusts a drain current of the selected reference cell RC(i,j) in order to detect a magnitude of noise (S240). For example, a drain current Id of the selected reference cell RC(i,j) is measured during a predetermined time under a predetermined bias condition. A magnitude of noise can be measured according to a fluctuation ΔId of drain current Id measured during a predetermined time. Alternatively, it is possible to detect whether a magnitude of the measured drain current Id is within a Gaussian distribution. That is, it is possible to detect noise is included in the measured drain current via a probability distribution. Alternatively, it is possible to judge whether noise is included in the measured drain current according to a deviation of a magnitude of a drain current from its defined average value.

Next, the method judges whether the selected reference cell is the last reference cell RC(i,j) in reference cell array 161 (S250). Where the selected reference cell RC(i,j) is not the last reference cell (i≠imax or j≠jmax) (S250=No), the tester increases a variable 'i' or 'j' to select a next reference cell (S260) and the method returns to step S210. Otherwise (S250=Yes), a reference cell is selected for providing a reference current in a read operation (S270).

The tester can select the reference cell according to a magnitude ΔId of the measured noise or the probability distribution of a drain current. For example, the tester may first select reference cells being substantially free from noise or having relatively low noise, depending upon a magnitude ΔId of the measured noise or the probability distribution of a drain current. Alternatively, reference cells can be selected by excluding reference cells whose magnitudes ΔId of the measured noise or the probability distributions of drain currents do not satisfy a reference condition.

As described with reference to FIG. 2, a reference cell can be selected for a read operation based on favorable noise characteristics. Alternatively, as described with reference to FIG. 4, reference cells can be excluded for read operations based on unfavorable noise characteristics. A tester can store location information of selected reference cells in a selection information memory 165.

Using the method of FIG. 7, it is possible to generate a reference current with relatively high precision by appropriate selection of reference cells. As a result, a read margin of memory cells can be improved. Moreover, it is possible to increase the yield of a nonvolatile memory device by excluding reference cells with relatively high noise.

In the embodiment of FIG. 7, steps S210 through S230 constitute a process for programming reference cells, and steps S240 through S270 constitute a process for measuring noise characteristics of reference cells and storing selection information. In various embodiments, these processes can be performed independent of each other.

Typically, the programming process is performed before the measuring and storing process. In one example, the programming process comprises selecting a reference cell, adjusting a threshold voltage of the selected reference cell, and determining whether a drain current of the selected reference cell is within an allowable range. The process further comprises, where the drain current of the selected reference cell is not within an allowable range, returning to the adjusting, and otherwise, determining whether all reference cells are selected. The process still further comprises, where the reference cells are not selected, returning to the selecting, and where all reference cells are selected, ending the process.

In one example, the measuring and storing process comprises selecting a reference cell, determining whether a drain current of the selected reference cell is measured, determining whether all reference cells are selected, where all reference cells are not selected, returning to the selecting, where all reference cells are selected, storing selection information in a selection information memory based on measured results, and ending the process.

Figure 8:
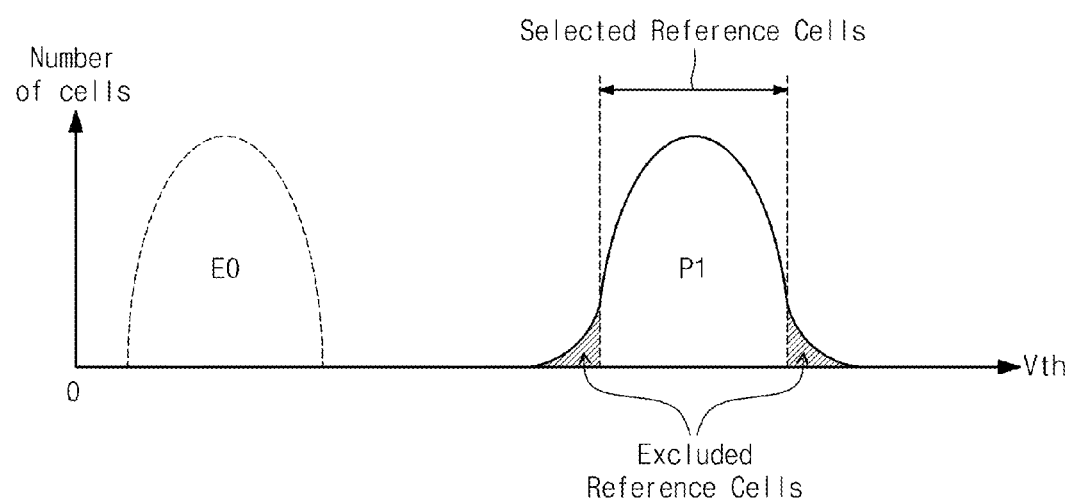
FIG. 8 is a graph illustrating threshold voltage distributions of reference cells.

FIG. 8 is a graph illustrating threshold voltage distributions of reference cells. For explanation purposes, it is assumed that the threshold voltage distributions of FIG. 8 correspond to reference cells included in reference cell array 161 of FIG. 2 or 4. In FIG. 8, a threshold voltage distribution E0 corresponds to an erase state, and a threshold voltage distribution P1 corresponds to a program state P1.

In the event that reference cells are programmed to program state P1, a threshold voltage distribution of reference cells may have a normal distribution. However, there may be reference cells with defects or RTN noise. Threshold voltages of such reference cells are distributed at lower and upper tails of a threshold voltage distribution P1 as shown in FIG. 8.

Where a reference current is generated using reference cells at lower and upper tails of a threshold voltage distribution P1, a read operation may be made inexactly. With the methods of FIGS. 6 and 7, reference cells that are defective or have RTN noise are excluded from a reference cell group used to generate a reference current.

Figure 9:
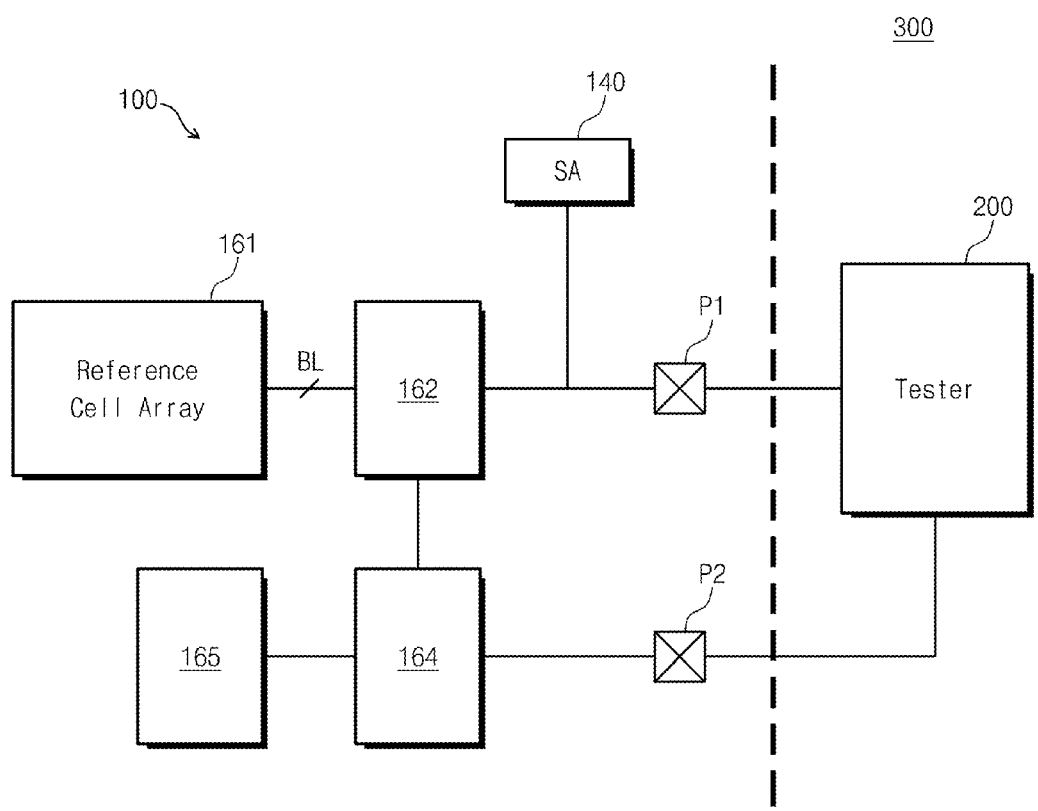
FIG. 9 is a block diagram illustrating a test system according to an embodiment of the inventive concept.

FIG. 9 is a block diagram illustrating a test system 300 according to an embodiment of the inventive concept.

Referring to FIG. 9, test system 300 comprises a nonvolatile memory device 100 and a tester 200. Nonvolatile memory device 100 is identical to that in FIG. 2, so a description thereof will be omitted. As illustrated in FIG. 9, pads P1 and P2 are provided in nonvolatile memory device 100. Pads P1 and P2 are test pads (or, non-bonding pads) used in a test process. Pad P2 is used to connect a reference cell selector 164 to tester 200. In a test mode, reference cell selector 164 is configured not to receive information from selection information memory 165. In the test mode, reference cell selector 164 receives information indicating a test mode from tester 200 via pad P2. This information can include, for instance, addresses for selecting reference cells. In some embodiments, pad P2 is optionally used. In some examples, reference cell selector 164 is controlled by control logic 170 of nonvolatile memory device 100 at a test mode.

A bit line BL selected by bit line selector 162 is supplied with a current from tester 200 via pad P1 in a test mode. In the test mode, tester 200 measures (or, monitors) a current flowing via the selected bit line as a drain current. Tester 200 determines noise characteristics of a selected reference cell connected with the selected bit line according to the measured/monitored current. A reference cell selecting operation and a current measuring operation are repeated until all reference cells are selected. Selection information is stored in selection information memory 165 according to noise characteristics measured by tester 200.

Figure 10:
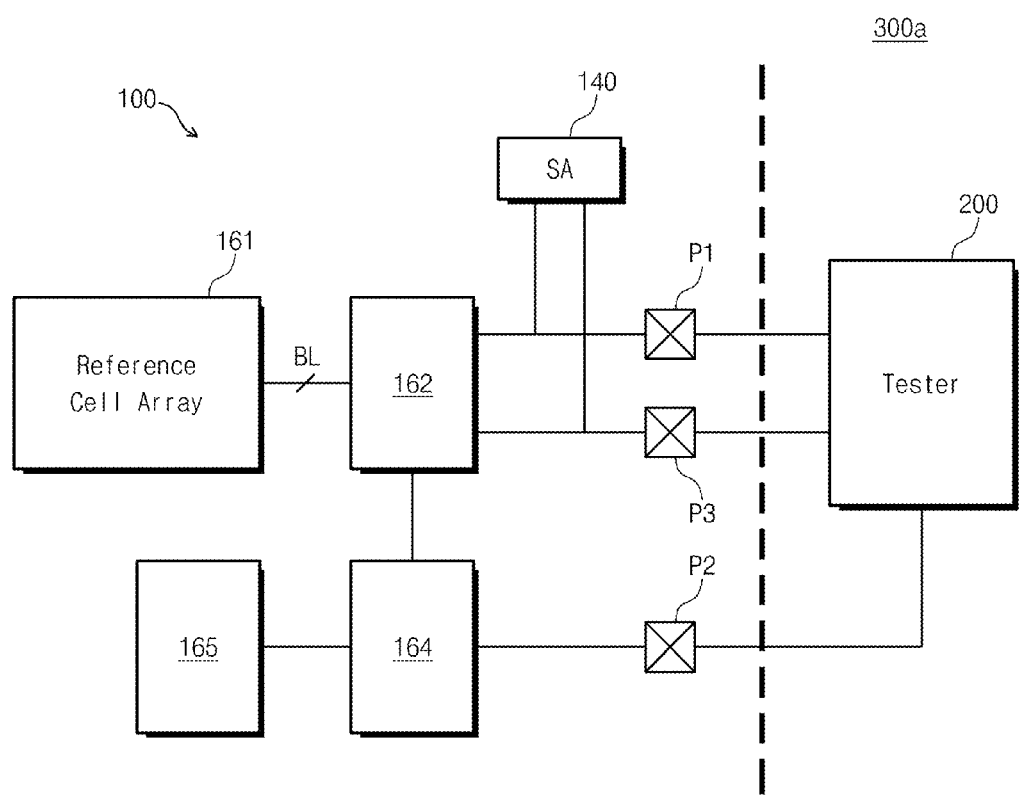
FIG. 10 is a block diagram illustrating a test system according to another embodiment of the inventive concept.

FIG. 10 is a block diagram illustrating a test system 300a according to another embodiment of the inventive concept.

Referring to FIG. 10, test system 300a comprises nonvolatile memory device 100 and tester 200. Nonvolatile memory device 100 is identical to that in FIG. 4, so a description thereof is omitted. Test system 300a FIG. 10 is identical to that in FIG. 9 except that currents flowing via two selected reference cells are measured at the same time via pads P1 and P3 by tester 200.

Figure 11:
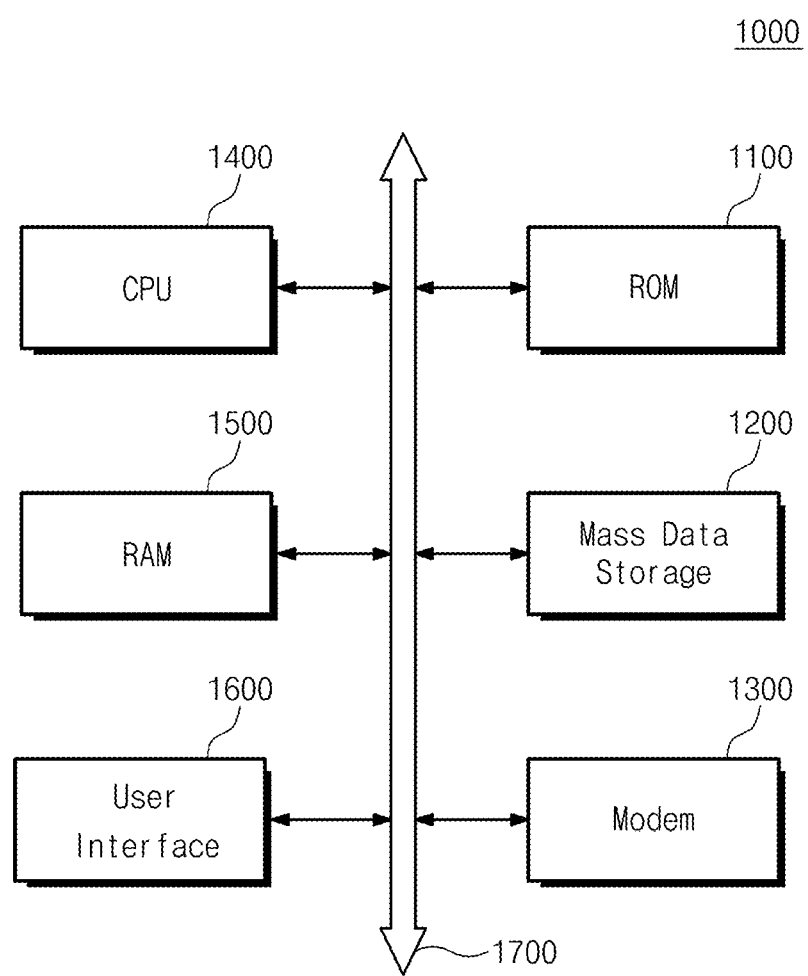
FIG. 11 is a block diagram illustrating a computing system incorporating a nonvolatile memory device according to an embodiment of the inventive concept.

FIG. 11 is a block diagram illustrating a computing system 1000 incorporating a nonvolatile memory device according to an embodiment of the inventive concept. In the embodiment of FIG. 11, the nonvolatile memory device is used as a ROM 1100.

Referring to FIG. 11, computing system 1000 comprises ROM 1100, mass data storage 1200, a modem 1300 such as a baseband, a CPU 1400, a RAM 1500, and a user interface 1600.

Where computing system 1000 is a mobile device, a battery (not shown) can be further provided in order to supply power. Although not shown in FIG. 11, computing system 1000 may further comprise additional features such as an application chipset or a camera image sensor (CIS).

ROM 1100 can be used for code storage in computing system 1000. Accordingly, ROM 1100 can potentially improve the reliability of computing system 1000.

The above-described nonvolatile memory devices can be packaged using various types of packages, such as package on package (PoP), Ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), system in package (SIP), multi chip package (MCP), wafer-level fabricated package (WFP), and wafer-level processed stack package (WSP).

While the inventive concept has been particularly shown and described with reference to embodiments thereof, it will be understood by those of ordinary skill in the art that various changes in form and detail may be made therein without departing from the scope of the inventive concept as defined by the following claims. The described embodiments should be considered in a descriptive sense only and not for purposes of limitation.

What is claimed is:

1. A method of setting a reference current of a nonvolatile memory device, comprising:
    measuring a noise characteristic of each of multiple reference cells; and
    selecting at least one of the reference cells as a reference cell for generating a reference current to be compared with a sensing current flowing through a selected memory cell in a read operation of the nonvolatile memory device, according to the measured noise characteristics.

2. The method of claim 1, wherein the noise characteristics are measured by measuring respective drain currents of the reference cells.

3. The method of claim 2, wherein measuring the noise characteristic comprises:
    selecting one of the reference cells;
    biasing the selected reference cell using predetermined voltage conditions for measuring the noise characteristic; and
    measuring a drain current of the selected reference cell under the predetermined voltage conditions.

4. The method of claim 3, wherein measuring the drain current is performed during a reference time.

5. The method of claim 4, wherein a noise magnitude is determined according to a fluctuation of the drain current measured during the reference time.

6. The method of claim 5, further comprising determining the selected reference cell to be a reference cell for generating a reference current upon determining that noise magnitude is below a reference value.

7. The method of claim 4, wherein a noise characteristic of each reference cell is measured according to a probability distribution of magnitudes of the drain current measured during the reference time.

8. The method of claim 7, further comprising excluding the selected reference cell from a cell group used to generate a reference current upon determining that magnitudes of the drain current measured during the reference time form an abnormal distribution.

9. The method of claim 1, further comprising adjusting a threshold voltage of each of the reference cells.

10. The method of claim 9, wherein the threshold voltages of the reference cells are adjusted using a program or erase operation.

11. A nonvolatile memory device, comprising:
a main cell array comprising a plurality of memory cells;
a reference signal generator generating a reference current for reading data stored in a selected one of the plurality of memory cells; and
a sense amplifier identifying data stored in the selected memory cell by comparing the reference current to a sensing current flowing through the selected memory cell,
wherein the reference signal generator comprises a plurality of reference cells and generates the reference current from at least one of the plurality of reference cells, the at least one reference cell being selected according to measured noise characteristics of the plurality of reference cells.

12. The nonvolatile memory device of claim 11, wherein the reference signal generator further comprises a selection information memory that stores selection information associated with the at least one reference cell.

13. The nonvolatile memory device of claim 12, wherein the selection information is generated by measuring noise characteristics of the plurality of reference cells upon testing.

14. The nonvolatile memory device of claim 13, wherein the selection information is generated according to a magnitude of a noise in each of the plurality of reference cells.

15. The nonvolatile memory device of claim 14, wherein the selection information comprises location information associated with reference cells that are excluded when the reference current is generated.

16. A method of generating a reference current to be compared with a sensing current flowing through a selected memory cell in a read operation of a nonvolatile memory device, comprising:
identifying a plurality of reference cells having noise characteristics within a predetermined limit; and
combining currents associated with the plurality of reference cells to generate the reference current.

17. The method of claim 16, wherein combining the currents comprises generating an average of the currents as the reference current.

18. The method of claim 16, wherein identifying the plurality of reference cells having noise characteristics within the predetermined limit comprises applying predetermined bias voltages to the reference cells, and measuring fluctuations of respective drain currents of the reference cells during a reference time.

19. The method of claim 18, wherein the predetermined limit is a magnitude of drain current fluctuation.

20. The method of claim 16, further comprising storing an indication of the noise characteristics in a selection information memory, and accessing the selection information memory to identify the plurality of reference cells having the noise characteristics within the predetermined limit.

* * * * *